United States Patent
Weng

(10) Patent No.: US 9,806,745 B2
(45) Date of Patent: Oct. 31, 2017

(54) SYSTEMS AND METHODS FOR LOW PASS FILTER MISMATCH CALIBRATION

(71) Applicant: Marvell World Trade Ltd., St. Michael (BB)

(72) Inventor: Wen-Yen Weng, Santa Clara, CA (US)

(73) Assignee: MARVELL WORLD TRADE LTD., St. Michael (BB)

( * ) Notice: Subject to any disclaimer, the term of this patent is extended or adjusted under 35 U.S.C. 154(b) by 0 days.

(21) Appl. No.: 15/004,044

(22) Filed: Jan. 22, 2016

(65) Prior Publication Data

US 2016/0233916 A1    Aug. 11, 2016

Related U.S. Application Data

(60) Provisional application No. 62/114,229, filed on Feb. 10, 2015.

(51) Int. Cl.
| | |
|---|---|
| H04B 1/40 | (2015.01) |
| H03H 11/06 | (2006.01) |
| H04B 1/04 | (2006.01) |
| H04B 17/11 | (2015.01) |
| H04B 1/30 | (2006.01) |

(52) U.S. Cl.
CPC .......... H04B 1/0475 (2013.01); H04B 17/11 (2015.01); H03H 2210/04 (2013.01); H04B 1/30 (2013.01)

(58) Field of Classification Search
CPC ..... H03H 2210/04; H04B 1/0475; H04B 1/30
See application file for complete search history.

(56) References Cited

U.S. PATENT DOCUMENTS

| | | | | |
|---|---|---|---|---|
| 8,917,125 | B1* | 12/2014 | Waltari | H03M 1/124 327/147 |
| 9,008,161 | B1* | 4/2015 | Chang | H04L 25/03261 375/219 |
| 2006/0261989 | A1* | 11/2006 | Farooqi | H03M 3/344 341/118 |
| 2009/0054007 | A1* | 2/2009 | Kawabe | H04B 1/30 455/76 |
| 2011/0140946 | A1* | 6/2011 | Sheppard | H03M 1/0626 341/155 |
| 2012/0300818 | A1* | 11/2012 | Metreaud | H04B 1/30 375/219 |
| 2015/0155898 | A1* | 6/2015 | Pinagapany | H04B 17/0085 375/350 |
| 2016/0080010 | A1* | 3/2016 | Ota | H04B 1/0053 455/114.3 |

* cited by examiner

*Primary Examiner* — Ross Varndell

(57) ABSTRACT

System and methods are provided for calibration of low pass filter mismatch. An example system includes: a tone generator configured to generate a tone signal with a baseband frequency value; one or more low pass filters configured to filter one or more analog signals associated with the tone signal; one or more analog-to-digital converters (ADCs) configured to generate one or more aliases associated with the one or more analog signals; and a calibration processor configured to detect low pass filter mismatch based at least in part on the one or more aliases associated with the tone signal.

15 Claims, 6 Drawing Sheets

SYSTEMS AND METHODS FOR LOW PASS FILTER MISMATCH CALIBRATION

CROSS-REFERENCE TO RELATED APPLICATIONS

This disclosure claims priority to and benefit from U.S. Provisional Patent Application No. 62/114,229, filed on Feb. 10, 2015, the entirety of which is incorporated herein by reference.

FIELD

The technology described in this patent document relates generally to communication systems and more particularly to low pass filter mismatch calibration.

BACKGROUND

Design of wireless communication transmitters and/or receivers often involves certain bandwidth and sensitivity limitations. For example, an in-phase (I) channel and a quadrature-phase (Q) channel are often necessary for any angle modulated signals because two sidebands of the RF spectrum contain different information and may result in irreversible corruption if they overlap each other without being separated into two phases. A receiver or a transmitter can use the I channel and the Q channel to form the I component and the Q component of a received signal. Each channel may include a low pass filter. The low pass filters in the two channels may need to have identical characteristics to avoid signal errors.

However, the low pass filters in the I channel and the Q channel may have bandwidth mismatch due to imperfect bandwidth calibration. For example, inaccuracy in capacitance or resistance related to the two distinct channels may cause such bandwidth mismatch. The low pass filter mismatch often results in frequency dependent group delay or phase mismatch and causes degradation of the signal quality. For example, the low pass filter mismatch can degrade the error vector magnitude (EVM) of a transmitter and/or the sensitivity of a receiver.

SUMMARY

In accordance with the teachings described herein, system and methods are provided for calibration of low pass filter mismatch. An example system includes: a tone generator configured to generate a tone signal with a baseband frequency value; one or more low pass filters configured to filter one or more analog signals associated with the tone signal; one or more analog-to-digital converters (ADCs) configured to generate one or more aliases associated with the one or more analog signals; and a calibration processor configured to detect low pass filter mismatch based at least in part on the one or more aliases associated with the tone signal.

In one embodiment, a method is provided for calibration of low pass filter mismatch. A tone signal with a baseband frequency value is generated. One or more analog signals associated with the tone signal are filtered using one or more low pass filters. One or more aliases associated with the one or more analog signals are generated. Low pass filter mismatch is detected based at least in part on the one or more aliases associated with the tone signal.

DETAILED DESCRIPTION

Figure 1:
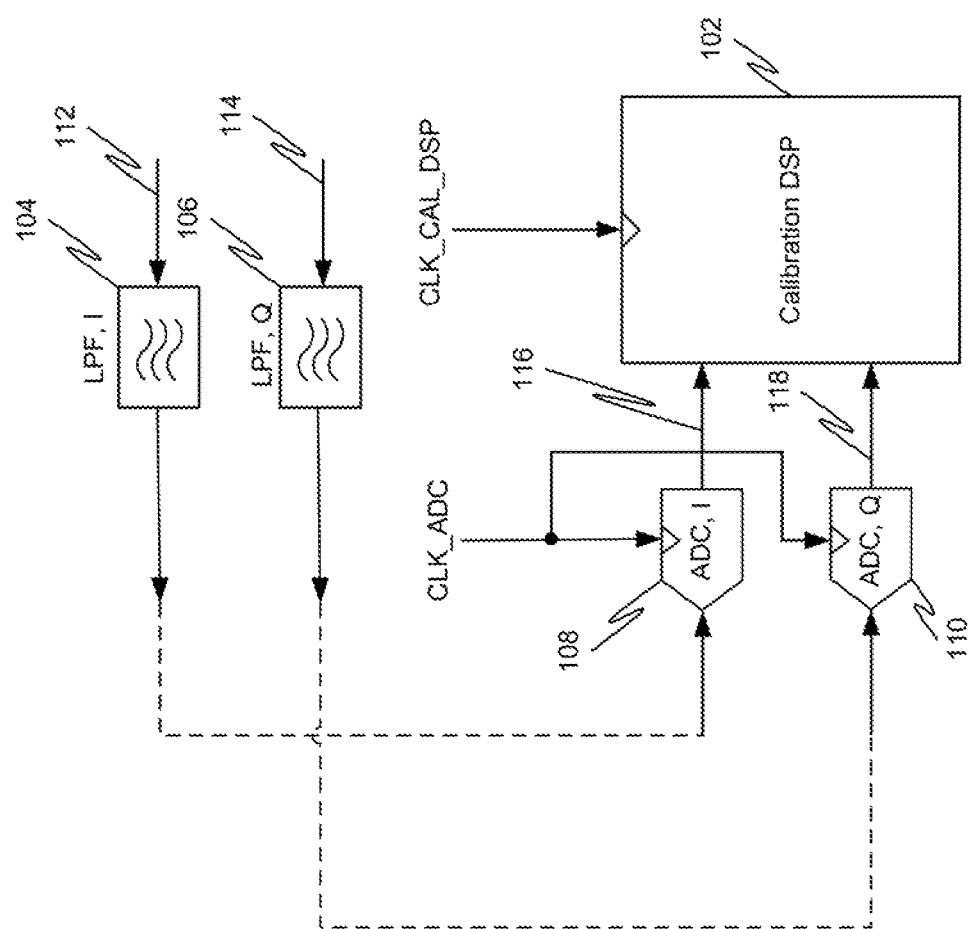
FIG. 1 depicts an example diagram for low pass filter mismatch calibration.

Calibration is usually needed to reduce low pass filter mismatch. As shown in FIG. 1, a calibration digital-signal processor (DSP) 102 may be implemented for calibration of low pass filters. Specifically, low pass filters 104 and 106 filter the I component 112 and the Q component 114 of a tone signal respectively. Analog-to-digital converters (ADCs) 108 and 110 are used for sampling signals related to the I component and the Q component of the tone signal and providing output signals 116 and 118 to the calibration DSP 102 for calibration. Particularly, the ADCs 108 and 110 convert analog signals (e.g., a function of continuous time and/or space) into numeric sequences (e.g., a function of discrete time and/or space). According to the signal-sampling theorem (i.e., the Nyquist theorem), a sufficient sampling rate usually corresponds to at least two sampling per cycle of an input signal in order to reconstruct the input signal. That is, if the input signal has a frequency of B, the sampling rate may need to be at least 2×B. Thus, the sampling rates of the ADCs 108 and 110 and the calibration DSP 102 may need to be much higher than the frequency of the tone signal. However, in reality, high-sampling-rate ADCs and/or DSPs may not be available or may be very expensive. Under-sampling or sub-sampling (e.g., sampling at a rate below the theoretically-required frequency for a particular signal of interest) can be implemented for calibration to solve the problem.

Figure 2:
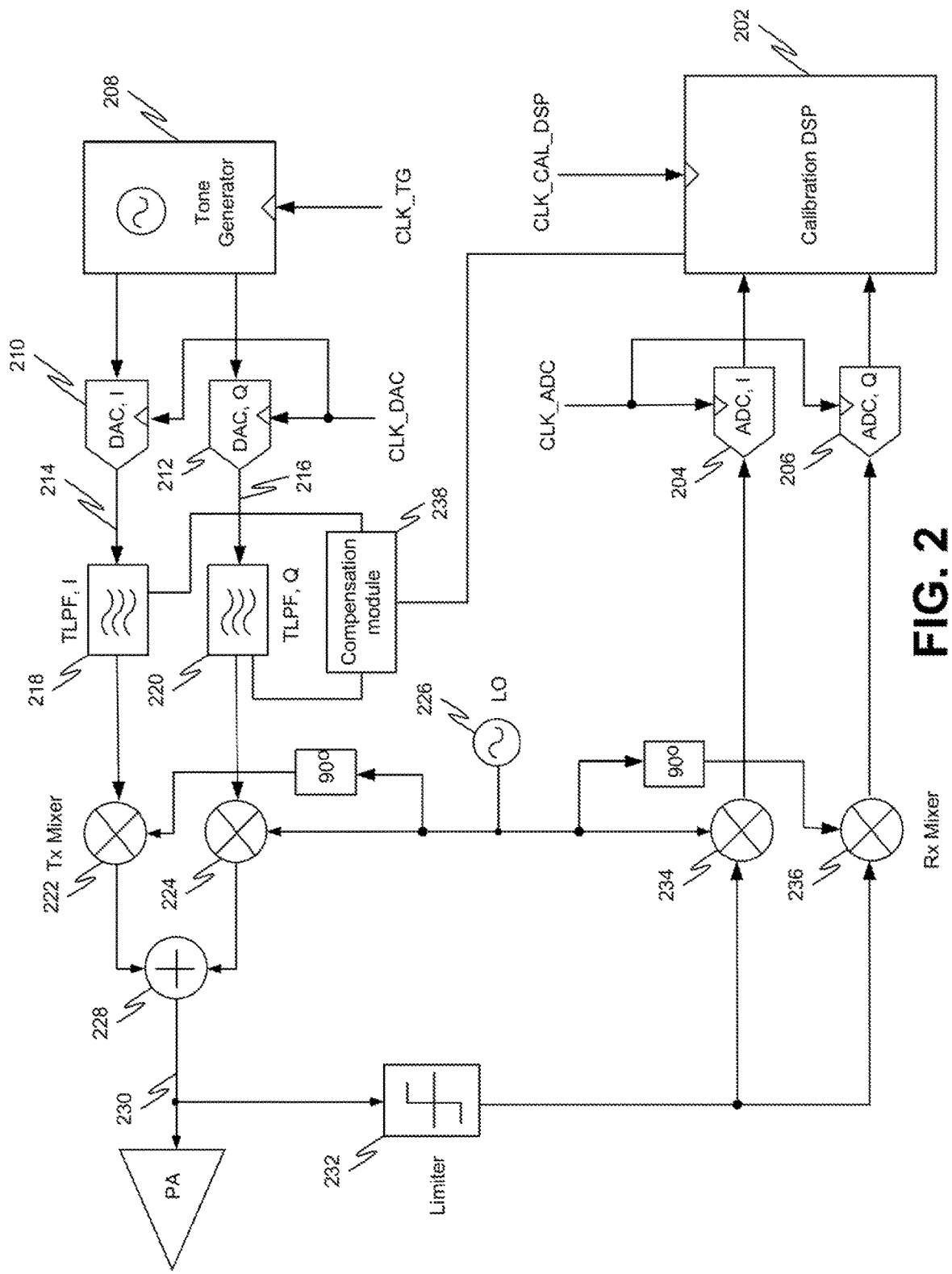
FIG. 2 depicts an example diagram showing a system for calibration of transmit low pass filter mismatch.
Figure 3A:
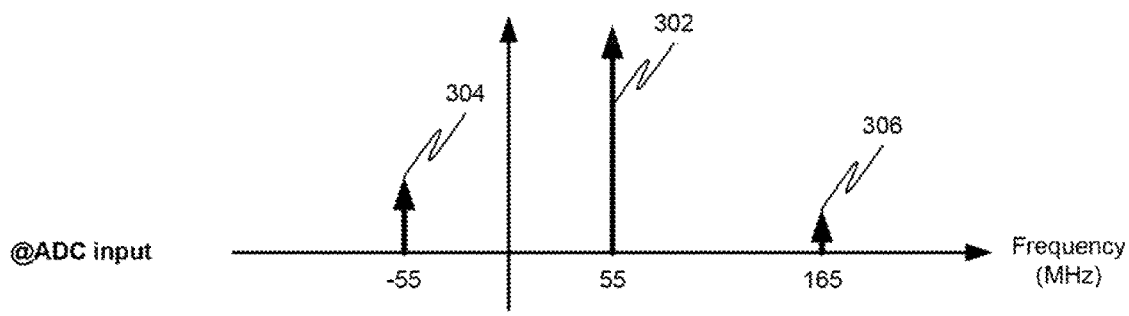
FIG. 3(A)-FIG. 3(C) depict example diagrams showing frequency analysis for low pass filter mismatch calculation as shown in FIG. 2.
Figure 3B:
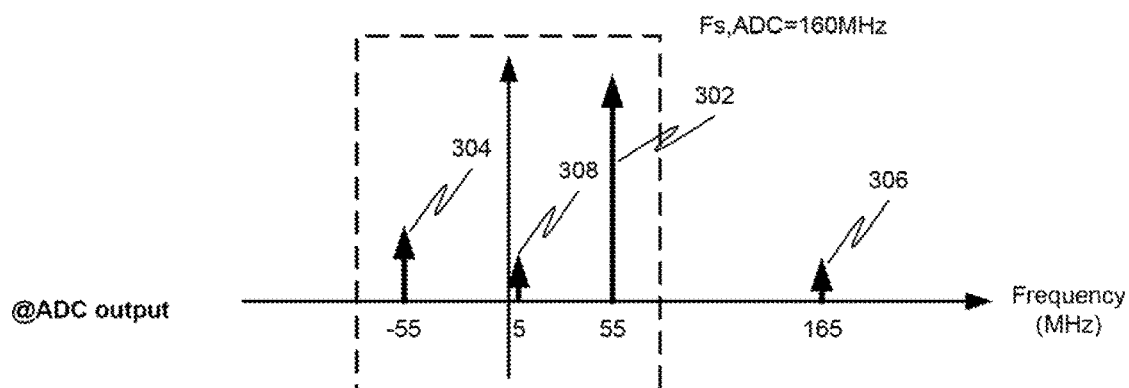
Figure 3C:
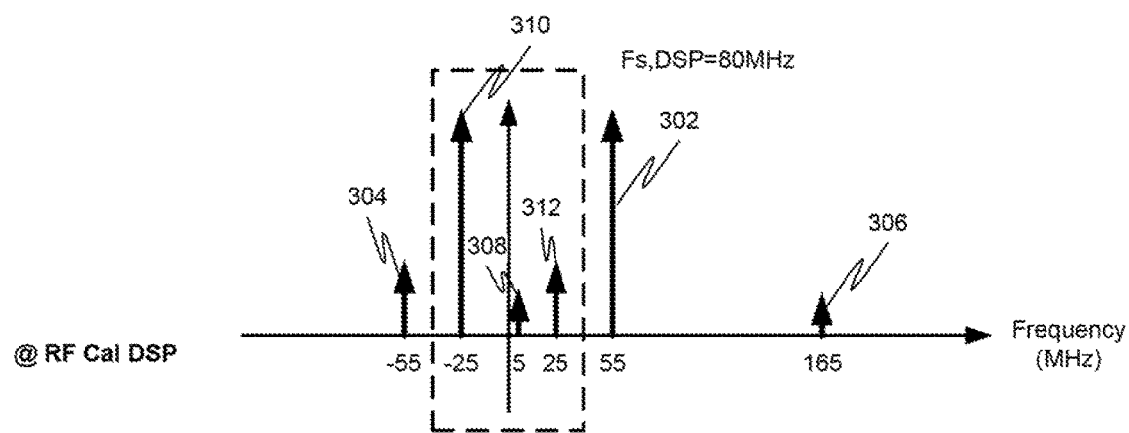

FIG. 2 depicts an example diagram showing a system for calibration of transmit low pass filter mismatch. As shown in FIG. 2, a calibration DSP 202 operates at a sampling rate lower than a theoretically-required frequency to detect low pass filter mismatch. For example, the calibration DSP 202 detects the low pass filter mismatch based on one or more aliases of intermodulation distortion (e.g., as shown in FIG. 3(A)-3(C)). A compensation module 238 adjusts parameters e.g., bandwidths) of transmit low pass filters 218 and 220 to reduce mismatches between these filters. In some embodiments, the compensation module 238 is included in the calibration DSP 202.

Specifically, a tone generator 208 generates a tone signal with a baseband frequency. An I channel and A Q channel are implemented to process the I component and the Q component of the tone signal respectively. Digital-to-analog converters (DACs) 210 and 212 convert the I component and the Q component of the tone signal to analog signals 214 and 216 respectively. In some embodiments, the tone signal generated by the tone generator 208 corresponds to a sinusoidal digital signal having the baseband frequency. The DACs 210 and 212 may be stimulated by a series of digital codes that correspond to sinusoidal excitation with the baseband frequency of the tone signal.

Transmit low pass filters (TLPFs) 218 and 220 filter the analog signals 214 and 216 respectively. For example, the TLPFs 218 and 220 can reduce/remove high frequency components in the analog signals 214 and 216 (e.g., spurious components at high frequencies). A transmit mixer 224 mixes the output of the TLPF 220 with a signal from a local oscillator 226. The signal from the local oscillator 226 undergoes a 90° phase shift before being mixed by a transmit mixer 222 with the output of the TLPF 218. For example, the mixers 222 and 224 may introduce image noises, intermodulation distortion (e.g., IM3), spurious responses, and other nonlinear phenomena. A combination component 228 combines the outputs of the transmit mixers 222 and 224 which are associated with the I channel and the Q channel respectively, and provides a combined signal 230 to a limiter 232.

A receive mixer 234 mixes the output of the limiter 232 with a signal from the local oscillator 226. The signal from the local oscillator 226 undergoes a 90° phase shift before being mixed by a receive mixer 236 with the output of the limiter 232. ADCs 204 and 206 sample the outputs of the receive mixers 234 and 236, respectively, and generate digital outputs to the calibration DSP 202 for calibration. The calibration DSP 202 detects the low pass filter mismatch based on one or more aliases of intermodulation distortion that indicate the low pass filter mismatch.

FIG. 3(A)-FIG. 3(C) depict example diagrams showing frequency analysis for low pass filter mismatch calculation as shown in FIG. 2. The baseband frequency ($f_{BB}$) of the tone signal generated by the tone generator 208 is about 55 MHz. The inputs at the ADCs 204 and 206 include a number of components, as shown in FIG. 3(A). For example, a main component 302 appears at the baseband frequency, and an image 304 of the main component appears at −55 MHz. Intermodulation distortion 306 (e.g., IM3) that indicates the low pass filter mismatch appears at a frequency of 165 MHz which may be too high for the calibration DSP 202 to process.

As shown in FIG. 3(B), the sampling rate of the ADCs 204 and 206 is 160 MHz, and the ADCs 204 and 206 generate an alias 308 at 5 MHz for the intermodulation distortion 306. The alias 308 has a frequency low enough that can be processed by the calibration DSP 202. As shown in FIG. 3(C), the sampling rate of the calibration DSP 202 is 80 MHz, which is lower than the theoretically required sampling rate (e.g., 110 MHz). The main component 302 and the image component 304 fold into −25 MHz and 25 MHz respectively. The calibration DSP 202 may determine the amplitude/power of the intermodulation distortion 306 based on the alias 308 and thus detect the low pass filter mismatch so that the compensation module 238 can adjust the bandwidths of the filters 218 and 220 to reduce the filter mismatch.

In certain embodiments, if the calibration DSP 202 can only handle a limited number of frequencies, then the baseband frequency of the tone signal may be properly selected so that the alias 308 of the intermodulation distortion 306 appears at a particular frequency that the calibration DSP 202 can process.

Figure 4:
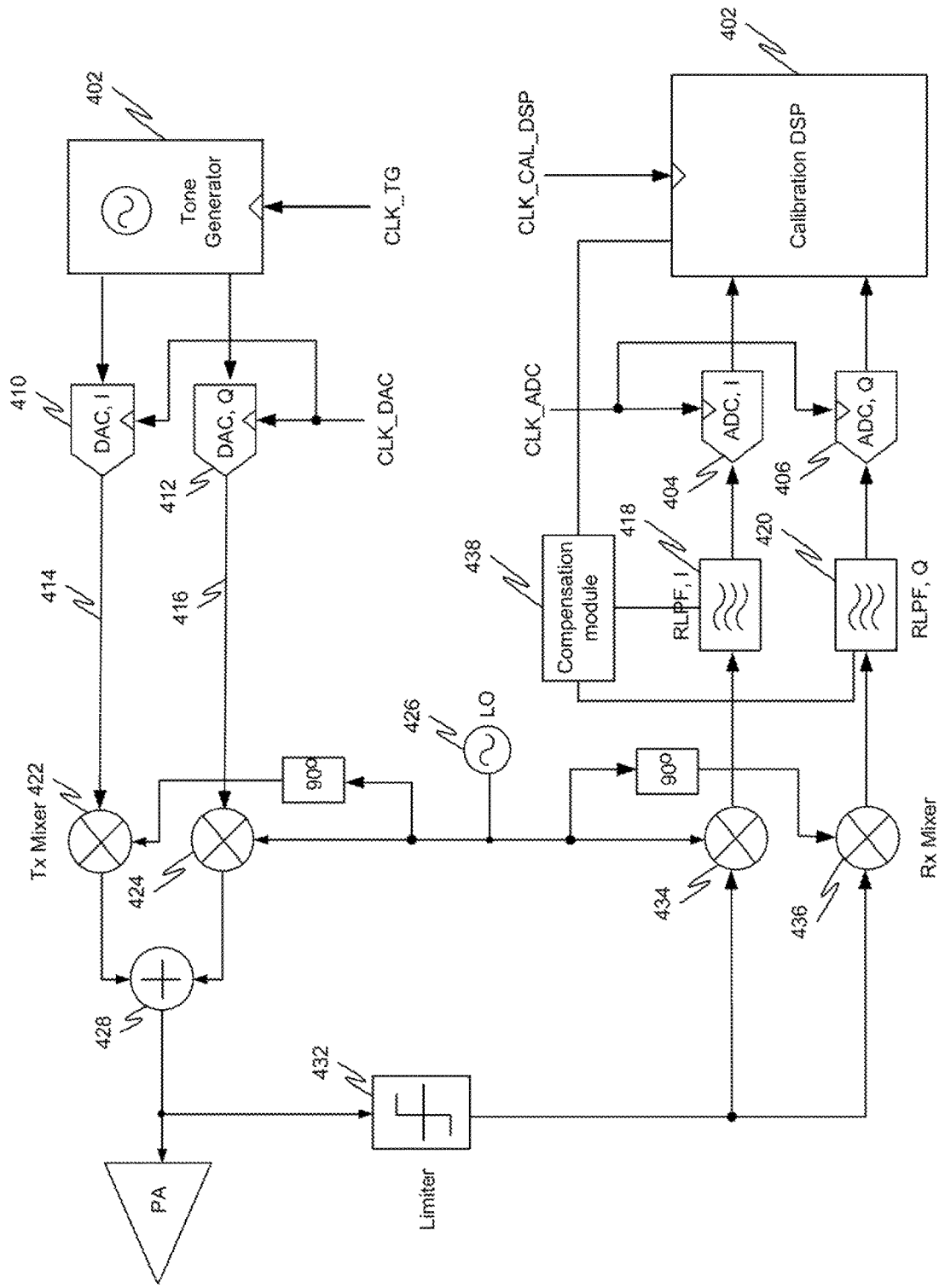
FIG. 4 depicts an example diagram showing a system for calibration of receive low pass filter mismatch.
Figure 5A:
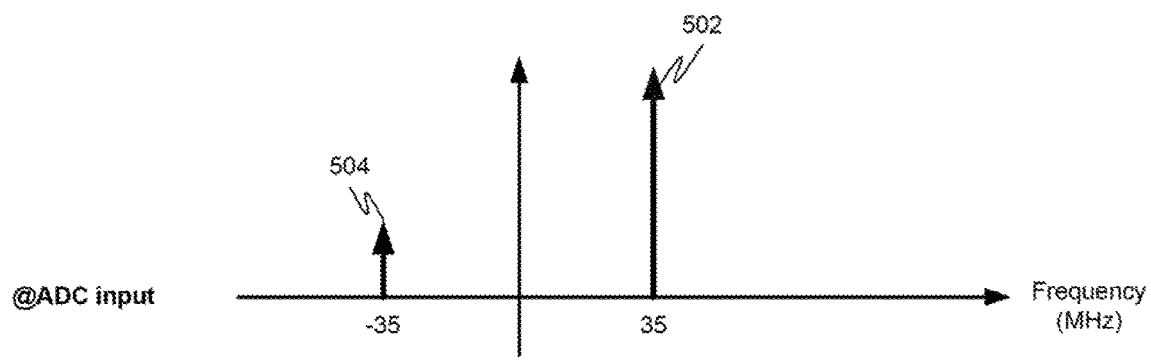
FIG. 5(A)-FIG. 5(C) depict example diagrams showing frequency analysis for low pass filter mismatch calculation as shown in FIG. 4.
Figure 5B:
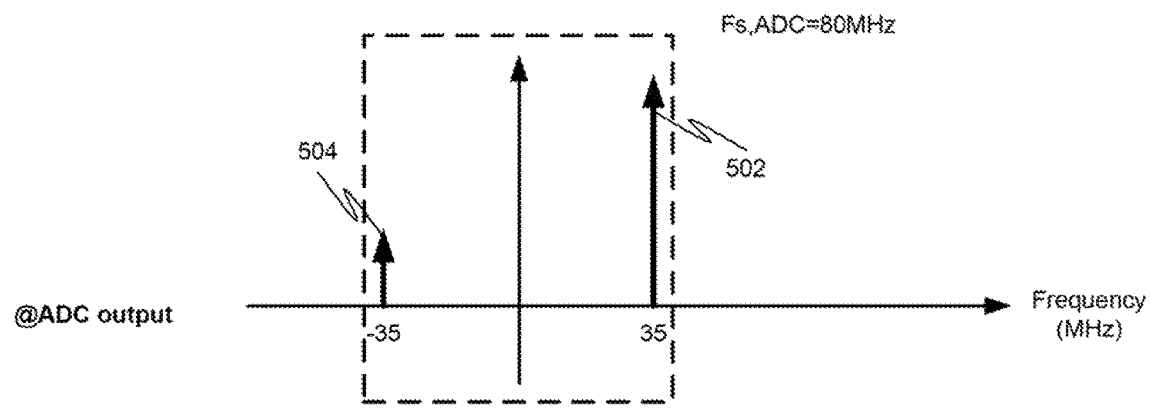
Figure 5C:
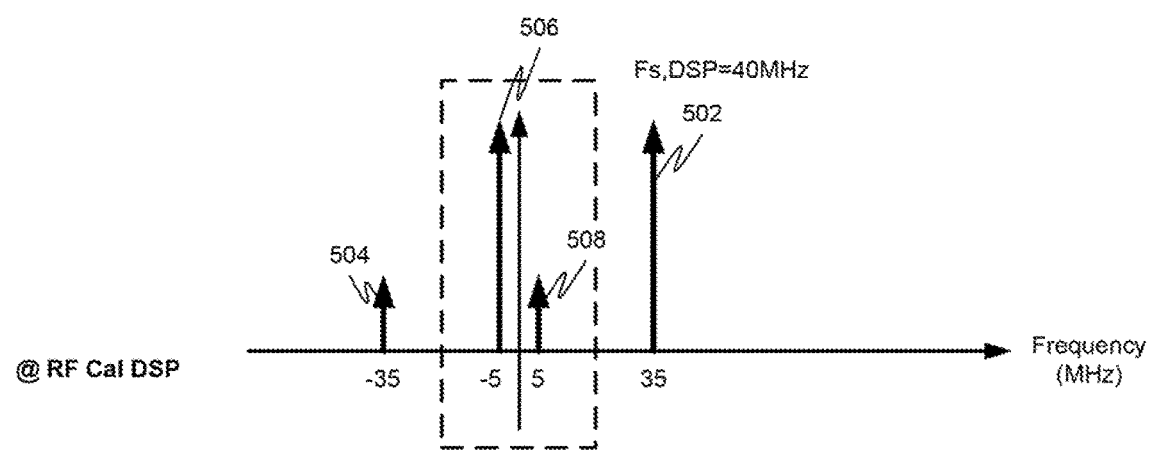

FIG. 4 depicts an example diagram showing a system for calibration of receive low pass filter mismatch. As shown in FIG. 4, a calibration DSP 402 operates at a sampling rate lower than a theoretically-required frequency to detect low pass filter mismatch. For example, the calibration DSP 202 detects the low pass filter mismatch based on one or more aliases of an image component related to a tone signal (e.g., as shown in FIG. 5(A)-5(C)). A compensation module 438 adjusts parameters (e.g., bandwidths) of transmit low pass filters 418 and 420 to reduce mismatches between these filters. In some embodiments, the compensation module 438 is included in the calibration DSP 402.

Specifically, a tone generator 408 generates a tone signal with a particular baseband frequency. An I channel and A Q channel are implemented to process the I component and the Q component of the tone signal respectively. Digital-to-analog converters (DACs) 410 and 412 convert the I component and the Q component of the tone signal to analog signals 414 and 416 respectively. A transmit mixer 424 mixes the analog signal 416 with a signal from a local oscillator 426. The signal from the local oscillator 426 undergoes a 90° phase shift before being mixed by a transmit mixer 422 with the analog signal 414. A combination component 428 combines the outputs of the transmit mixers 422 and 424 which are associated with the I channel and the Q channel respectively.

A receive mixer 434 mixes the output of the limiter 432 with a signal from the local oscillator 426. The signal from the local oscillator 426 undergoes a 90° phase shift before being mixed by a receive mixer 436 with the output of the limiter 432. ADCs 404 and 406 sample the outputs of the receive mixers 434 and 436, respectively, and generate digital outputs to the calibration DSP 402 for calibration. The calibration DSP 402 detects the low pass filter mismatch based on one or more aliases of an image component of the tone signal.

FIG. 5(A)-FIG. 5(C) depict example diagrams showing frequency analysis for low pass filter mismatch calculation as shown in FIG. 4. The baseband frequency ($f_{BB}$) of the tone signal generated by the tone generator 408 is equal to 35 MHz. The inputs at the ADCs 404 and 406 include a number of components, as shown in FIG. 5(A). For example, a main component 502 appears at the baseband frequency, and an image 504 of the main component appears at −35 MHz. The image 504 indicates the low pass filter mismatch and the DSP 402 may not be able to process the image 504 directly.

As shown in FIG. 5(B), the sampling rate of the ADCs 404 and 406 is 80 MHz, and the main component 502 and the image 504 can both be sampled by the ADCs 404 and 406. As shown in FIG. 5(C), the sampling rate of the calibration DSP 402 is 40 MHz, which is lower than the theoretically required sampling rate (e.g., 70 MHz). Aliases 506 (e.g., at −5 MHz) and 508 (e.g., at 5 MHz) may be generated for the main component 502 and the image component 504 respectively. The calibration DSP 402 may then determine the amplitude/power of the image 504 based on the alias 508 and thus determine the low pass filter mismatch so that the compensation module 438 can adjust the bandwidths of the filters 418 and 420 to reduce the filter mismatch.

In certain embodiments, if the calibration DSP 402 can only handle a limited number of frequencies, then the baseband frequency of the tone signal may be properly selected so that the alias 508 of the image component 504 has a particular frequency that the calibration DSP 402 can process. In some embodiments, the low pass filters 218 and 418 are the same, and the low pass filters 220 and 420 are the same.

Figure 6:
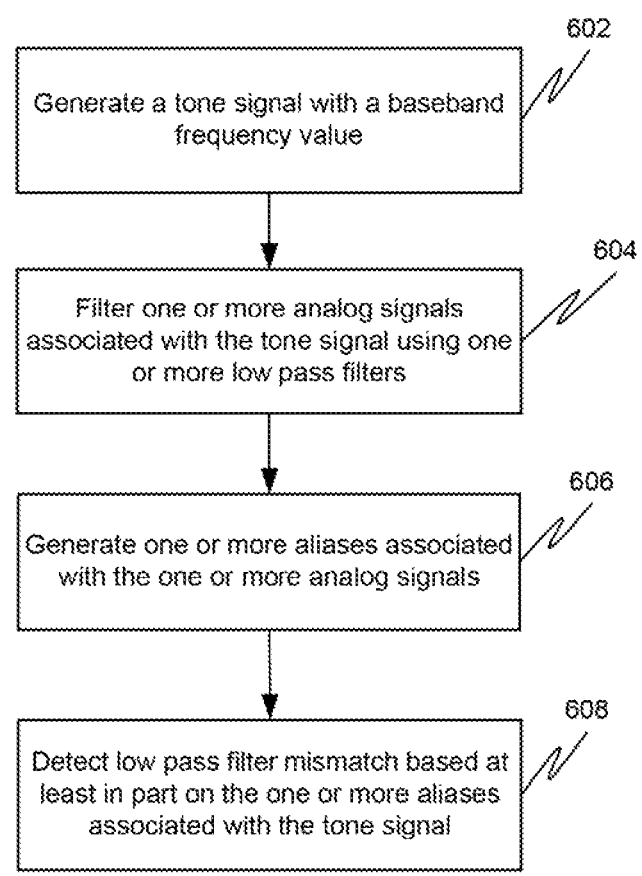
FIG. 6 depicts an example flow chart for low pass filter mismatch calibration.

FIG. 6 depicts an example flow chart for low pass filter mismatch calibration. At 602, a tone signal with a baseband frequency value is generated. At 604, one or more analog signals associated with the tone signal are filtered using one or more low pass filters. At 606, one or more aliases associated with the one or more analog signals are generated. At 608, low pass filter mismatch is detected based at least in part on the one or more aliases associated with the tone signal.

This written description uses examples to disclose the invention, include the best mode, and also to enable a person skilled in the art to make and use the invention. The patentable scope of the invention may include other examples that occur to those skilled in the art. Other implementations may also be used, however, such as firmware or appropriately designed hardware configured to carry out the methods and systems described herein. For example, the systems and methods described herein may be implemented in an independent processing engine, as a co-processor, or as a hardware accelerator. In yet another example, the systems and methods described herein may he provided on many different types of computer-readable media including computer storage mechanisms (e.g., CD-ROM, diskette, RAM, flash memory, computer's hard drive, etc.) that contain instructions (e.g., software) for use in execution by one or more processors to perform the methods' operations and implement the systems described herein.

What is claimed is:

1. A system for calibration of low pass filter mismatch, the system comprising:
   a tone generator configured to generate a tone signal with a baseband frequency value;
   low pass filters configured to filter one or more analog signals derived from the tone signal;
   one or more analog-to-digital converters (ADCs) configured to input signals derived from the filtered one or more analog signals to generate output signals that include one or more aliases; and
   a calibration processor configured to detect low pass filter mismatch based at least in part on the one or more aliases included in the output signals from the ADCs, wherein the calibration processor is configured to operate at a sampling rate lower than a Nyquist rate associated with the tone signal.

2. The system of claim 1, wherein:
   the calibration processor is associated with one or more calibration frequency values; and
   the tone generator is further, configured to select the baseband frequency value based at least in part on the one or more calibration frequency values.

3. The system of claim 1, wherein the one or more ADCs are further configured to generate the one or more aliases for an inter-modulation distortion (IMD) component related to the tone signal.

4. The system of claim 1, wherein the one or more ADCs are further configured to generate one or more aliases for an image of the tone signal.

5. The system of claim 1, further comprising:
   one or more digital-to-analog converters (DACs) configured to generate the one or more analog signals from the tone signal that is generated by the tone generator.

6. The system of claim 1, wherein the low pass filters include:
   an in-phase filter configured to process in-phase data of the one or more analog signals to generate a filtered in-phase (I) signal; and
   a quadrature filter configured to process quadrature-phase data of the one or more analog signals to generate a filtered quadrature (Q) signal.

7. The system of claim 6, wherein the calibration processor is further configured to detect bandwidth mismatch associated with the in-phase filter and the quadrature filter.

8. The system of claim 6, wherein the calibration processor is further configured to detect a phase mismatch associated with the in-phase filter and the quadrature filter.

9. The system of claim 6, further comprising: one or more transmit mixers configured to generate one or more modulation signals based at least in part on the filtered I signal and the filtered Q signal.

10. The system of claim 9, further comprising; one or more receive mixers configured to generate one or more input signals associated with the modulation signals;
    wherein the one or more ADCs are further configured to receive the input signals for generating the one or more aliases.

11. The system of claim 1, further comprising:
    one or more transmit mixers configured to generate one or more modulation signals based at least in part on the one or more analog signals.

12. The system of claim 11, further comprising:
    one or more receive mixers configured to generate one or more input signals associated with the modulation signals.

13. The system of claim 1 further comprising: a compensation module configured to adjust parameters of the one or more low pass filters to reduce the low pass filter mismatch.

14. A method for calibration of low pass filter mismatch, the method comprising:
    generating tone signal with a baseband frequency value;
    filtering, by low pass filters, one or more analog signals derived from the tone signal;
    generating one or more aliases from input signals that are derived from the filtered one or more analog signals, wherein generating one or more aliases associated with the one or more analog signals includes performing sampling at a sampling rate lower than a Nyquist rate associated with the tone signal; and
    detecting low as filter mismatch based at least in part on the one or more aliases.

15. The method of claim 14, wherein the baseband frequency value selected based at least in part on one or more calibration frequency values.

\* \* \* \* \*